(12) United States Patent
Wilson et al.

(10) Patent No.: US 12,085,977 B2
(45) Date of Patent: Sep. 10, 2024

(54) CLOCK DRIFT MONITOR

(71) Applicant: Hamilton Sundstrand Corporation, Charlotte, NC (US)

(72) Inventors: Michael A. Wilson, Scottsdale, AZ (US); Gary L. Hess, Somers, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 17/553,917

(22) Filed: Dec. 17, 2021

(65) Prior Publication Data

US 2023/0195160 A1 Jun. 22, 2023

(51) Int. Cl.
| | | |
|---|---|---|
| *G06F 1/08* | (2006.01) | |
| *G06F 1/12* | (2006.01) | |
| *G06F 9/30* | (2018.01) | |

(52) U.S. Cl.
CPC ............... *G06F 1/08* (2013.01); *G06F 1/12* (2013.01); *G06F 9/30021* (2013.01); *G06F 9/30029* (2013.01)

(58) Field of Classification Search
CPC .......... G06F 1/08; G06F 1/12; G06F 9/30021; G06F 9/30029
See application file for complete search history.

(56) References Cited

U.S. PATENT DOCUMENTS

| | | | |
|---|---|---|---|
| 5,533,053 A | * | 7/1996 | Hershbarger ....... H04L 25/0266 |
| | | | 333/33 |
| 6,774,823 B1 | | 8/2004 | Schafferer |
| 7,007,186 B1 | | 2/2006 | Li et al. |
| 8,258,775 B2 | | 9/2012 | Canac |
| 10,054,635 B2 | | 8/2018 | Lillestolen et al. |
| 10,250,375 B2 | | 4/2019 | Black et al. |
| 11,108,383 B1 | | 8/2021 | Moser et al. |
| 2008/0088351 A1 | | 4/2008 | Kimura |
| 2015/0227162 A1 | | 8/2015 | Zhu et al. |
| 2019/0288697 A1 | | 9/2019 | Ryu et al. |

FOREIGN PATENT DOCUMENTS

DE 3917433 A1 12/1990

OTHER PUBLICATIONS

European Search Report for Application No. 22211639.4, mailed May 15, 2023, 8 pages.

* cited by examiner

*Primary Examiner* — Zahid Choudhury
(74) *Attorney, Agent, or Firm* — CANTOR COLBURN LLP

(57) ABSTRACT

Provided are embodiments for monitoring clock drift. Embodiments may include an XOR gate that is configured to receive a first clock signal from a first clock source and a second clock signal from a second clock source, wherein the XOR logic gate is further configured to generate a switching output based on an XOR operation of the first clock signal and the second clock signal, and a rising edge detector and a falling edge detector that are configured to detect a rising edge and a falling edge of the switching output. Embodiments may also include an AND gate that is configured to threshold compare the rising edge to a configurable threshold to determine if a fault condition exists indicating clock drift between the first clock signal and the second clock signal and provide an indication of the fault condition based at least in part on the comparison.

20 Claims, 4 Drawing Sheets

CLOCK DRIFT MONITOR

BACKGROUND

The present invention relates to clock synchronization, and more specifically, to an XOR clock drift monitor.

Many avionics controls use multiple independent clock sources to maintain system redundancy. These clock sources may run asynchronously but must remain reasonably close in frequency to ensure that independent processing elements remain synchronized. Therefore, there may be a need to monitor the clock drift between independent clock sources.

BRIEF DESCRIPTION

According to an embodiment, a method for monitoring clock drift is provided. The method may comprise receiving a first clock signal from a first clock source and a second clock signal from a second clock source; generating a switching output based on the first clock signal and the second clock signal, wherein the switching output is proportional to a phase difference between the first clock signal and the second clock signal; detecting a rising edge and a falling edge of the switching output; comparing the rising edge to a configurable threshold to determine if a fault condition exists indicating clock drift between the first clock signal and the second clock signal; and providing an indication of the fault condition based at least in part on the comparison.

In addition to one or more of the features described herein, or as an alternative, further embodiments include receiving the first clock signal and the second clock signal at an exclusive-OR gate.

In addition to one or more of the features described herein, or as an alternative, further embodiments include an exclusive-OR gate that generates the switching output based on the first clock signal and the second clock signal.

In addition to one or more of the features described herein, or as an alternative, further embodiments include a switching output that is filtered using a Schmitt trigger buffer to generate a square wave signal having a duty cycle.

In addition to one or more of the features described herein, or as an alternative, further embodiments include a duty cycle that indicates a phase difference between the first clock signal and the second clock signal.

In addition to one or more of the features described herein, or as an alternative, further embodiments include a configurable threshold that corresponds to an extended falling edge that is triggered by the falling edge of the switching output.

In addition to one or more of the features described herein, or as an alternative, further embodiments include receiving the rising edge and the extended falling edge at a logic gate to determine if the rising edge overlaps the extended falling edge.

In addition to one or more of the features described herein, or as an alternative, further embodiments include providing the indication of the fault condition responsive to determining the rising edge overlaps the extended falling edge.

In addition to one or more of the features described herein, or as an alternative, further embodiments include a frequency of the first clock signal that is different than a frequency of the second clock signal.

In addition to one or more of the features described herein, or as an alternative, further embodiments include using a first clock signal and a second clock signal are received at a first clock divider and a second clock divider, respectively, wherein the first clock divider and the second divider are used to obtain a nominal signal of the first clock signal and the second clock signal for the comparison.

According to an embodiment, a circuit for monitoring clock drift is provided. The circuit may comprise an XOR gate configured to receive a first clock signal from a first clock source and a second clock signal from a second clock source, wherein the XOR logic gate is further configured to generate a switching output based on an XOR operation of the first clock signal and the second clock signal; a rising edge detector and a falling edge detector configured to detect a rising edge and a falling edge of the switching output; and an AND gate configured to threshold compare the rising edge to a configurable threshold to determine if a fault condition exists indicating clock drift between the first clock signal and the second clock signal, and provide an indication of the fault condition based at least in part on the comparison.

In addition to one or more of the features described herein, or as an alternative, further embodiments include a switching output that is proportional to a phase difference between the first clock signal and the second clock signal.

In addition to one or more of the features described herein, or as an alternative, further embodiments include using an XOR gate is configured to generate the switching output based on the first clock signal and the second clock signal.

In addition to one or more of the features described herein, or as an alternative, further embodiments include a Schmitt trigger buffer configured to receive the switching output from the XOR gate and generate a square wave signal having a duty cycle.

In addition to one or more of the features described herein, or as an alternative, further embodiments include using a duty cycle that indicates a phase difference between the first clock signal and the second clock signal.

In addition to one or more of the features described herein, or as an alternative, further embodiments include a re-triggerable one-shot circuit configured to generate an extended falling edge signal that is triggered by the falling edge of the switching output, wherein the extended falling edge signal corresponds to the configurable threshold.

In addition to one or more of the features described herein, or as an alternative, further embodiments include using an AND gate is configured to receive the rising edge and the extended falling edge to determine if the rising edge overlaps the extended falling edge to compare the rising edge to the configurable threshold.

In addition to one or more of the features described herein, or as an alternative, further embodiments include an AND gate that is configured to provide an output indicating the fault condition responsive to determining the rising edge overlaps the extended falling edge.

In addition to one or more of the features described herein, or as an alternative, further embodiments include using a frequency of the first clock signal is different than a frequency of the second clock signal.

In addition to one or more of the features described herein, or as an alternative, further embodiments include a first clock divider and a second clock divider that is configured to receive the first clock signal and the second clock, respectively, and the first clock divider and the second divider are configured to obtain a nominal signal of the first clock signal and the second clock signal for the comparison.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION OF THE DRAWINGS

The following descriptions should not be considered limiting in any way. With reference to the accompanying drawings, like elements are numbered alike.

DETAILED DESCRIPTION

An exclusive-OR (XOR) clock drift circuit can be used to monitor the relative frequency of two independent clock sources. A "fault" output signal generated by the XOR clock drift circuit may comprise a digital logic signal, which may be read by any general-purpose digital input buffer. The "fault" output signal will assert if the frequency difference between the two clocks exceeds a predetermined threshold.

Figure 1:
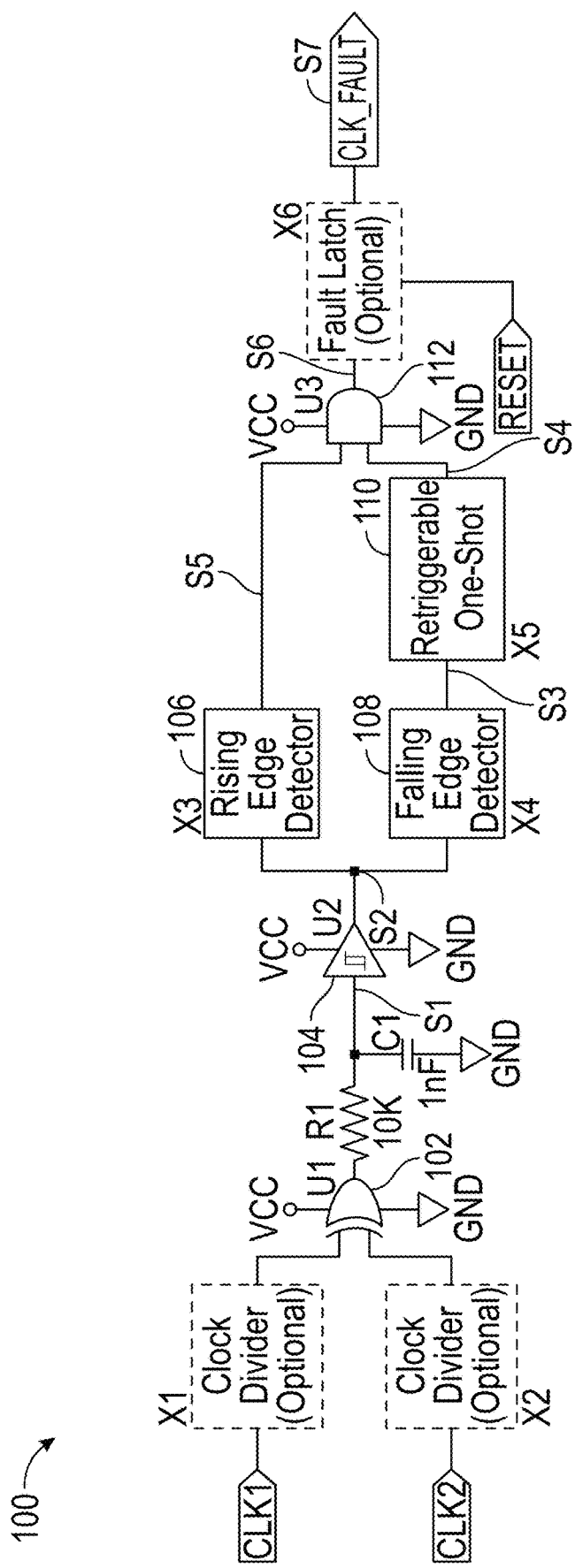
FIG. 1 depicts a circuit diagram for the clock drift monitoring circuit in accordance with one or more embodiments of the disclosure.

Referring to FIG. 1, a circuit 100 for monitoring clock drift in accordance with one or more embodiments of the disclosure is provided. The circuit 100 comprises a plurality of components and includes an exclusive-OR (XOR) gate 102, a buffer 104, a rising edge detector 106, a falling edge detector 108, a re-triggerable one-shot 110, and an AND gate 112 to implement monitoring the clock drift between a first clock signal CLK1 and a second clock signal CLK2. The sources for the first clock signal and the second clock signal are not shown. Upon receiving the first clock signal and the second clock signal, the XOR gate 102 generates an output signal which is provided to the buffer 104. The XOR gate 102 produces a switching output with a duty cycle that is proportional to the phase difference between the first and second clock signals. For example, the phase difference of 0° degrees has a duty cycle of 0%; the phase difference of ±90° degrees has a duty cycle of 50%; and the phase difference of ±180° degrees has a duty cycle of 100%.

In one or more embodiments of the disclosure, when the first clock signal and the second clock signal are different frequencies, the clock signals may be provided to a first clock divider circuit and a second clock divider circuit, respectively, to obtain nominal first clock signals and second clock signals prior to being provided to the XOR gate 102. In a non-limiting example, if CLK1 is 40 MHz and CLK2 is 30 MHz, then dividing the CLK1 by 4 and CLK2 by 3 using the clock divider circuits can result in a common clock outputs of nominal 10 MHz.

The output of the XOR gate 102 can be provided to a filter, such as a low-pass resistor-capacitor (RC), to generate a filtered XOR signal S1. The filtered XOR signal Si is provided to the buffer 104. In such an instance, the cutoff frequency of the RC low-pass filter should be set above the maximum expected CLK1-CLK2 frequency difference, but below the nominal clock frequencies. The output of the filter will be nominally centered at VCC/2.

Figure 2:
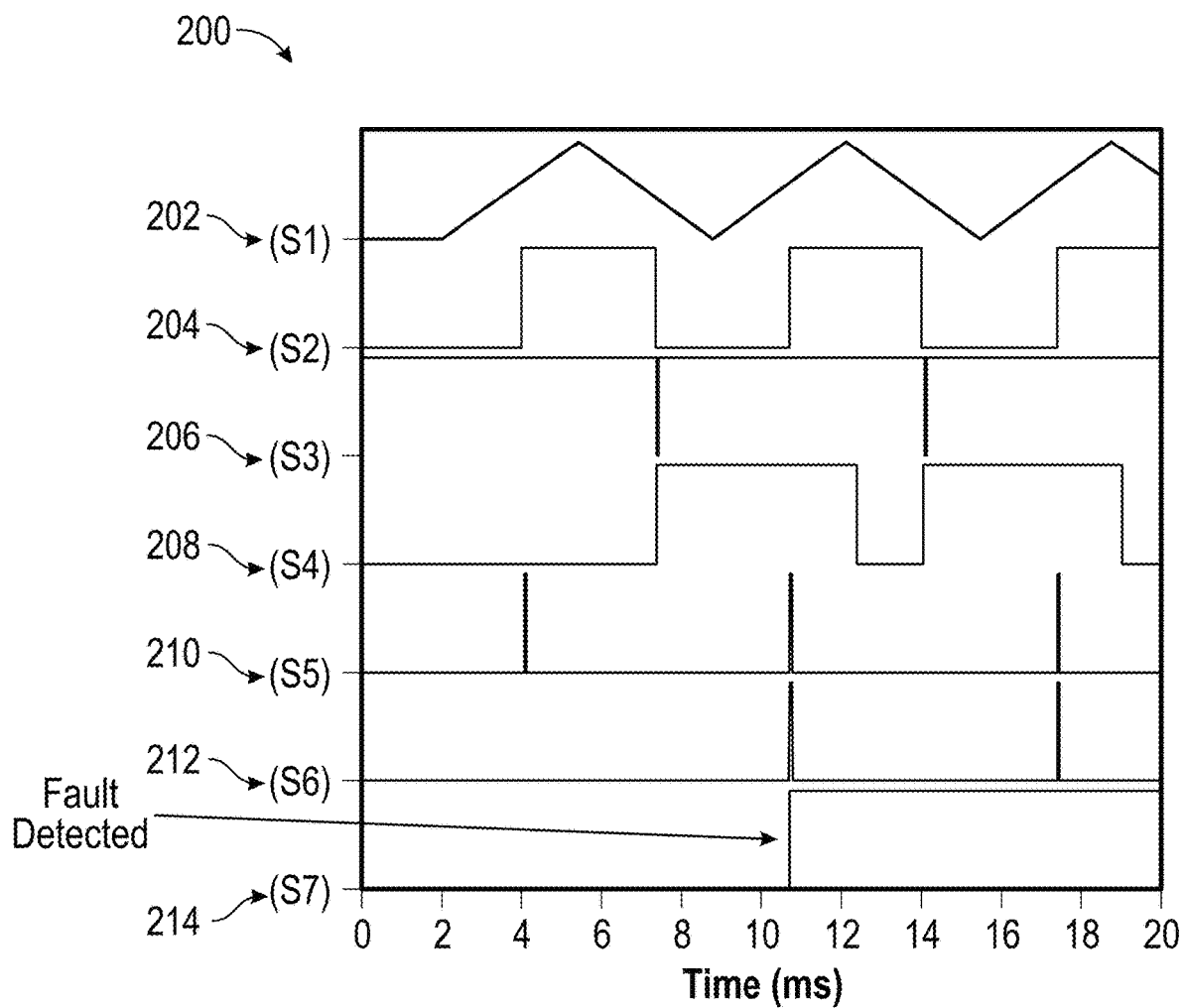
FIG. 2 depicts a timing diagram where a fault is detected by the clock drift monitoring circuit in accordance with one or more embodiments of the disclosure.
Figure 3:
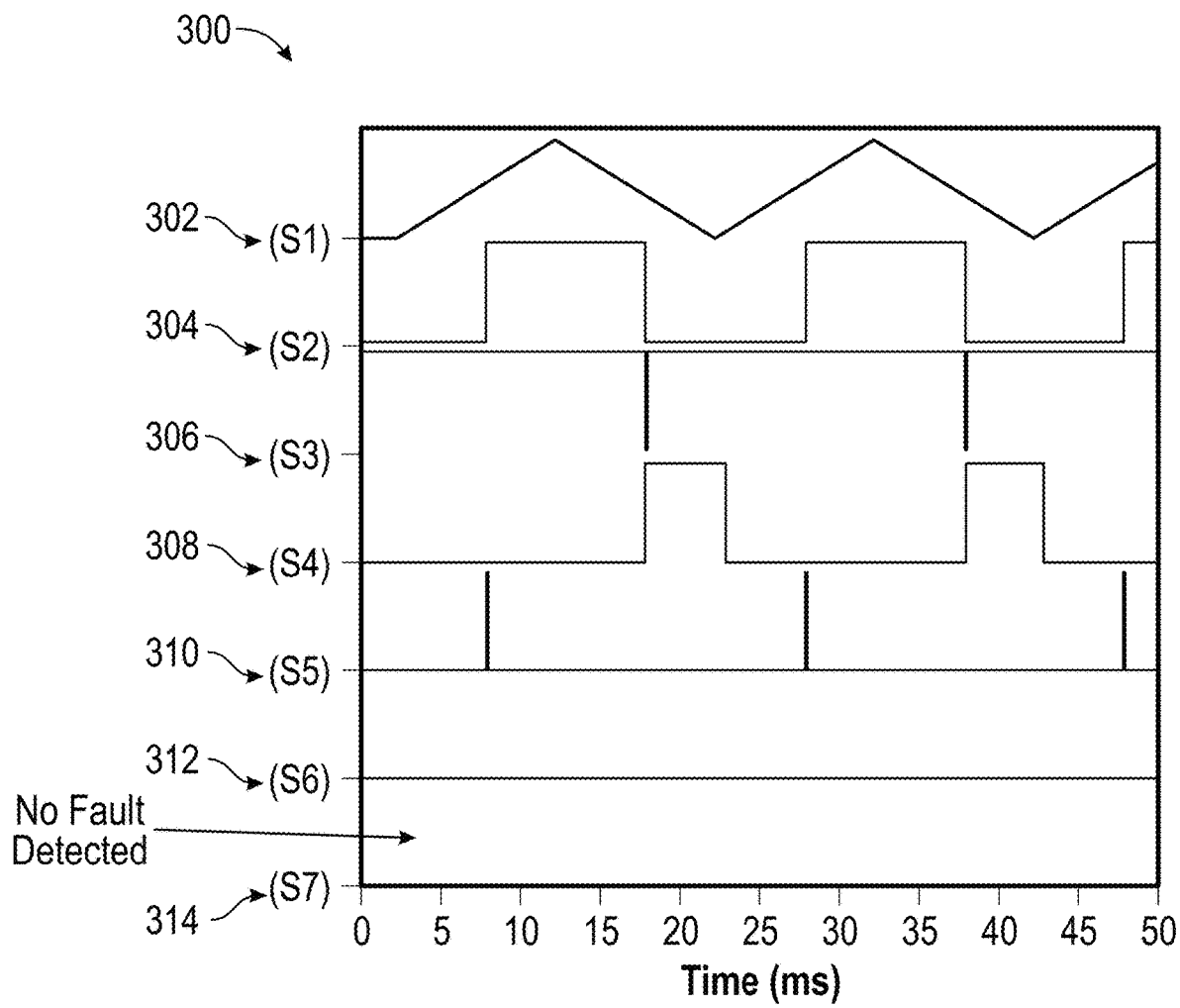
FIG. 3 depicts a timing diagram where no fault is detected by the clock drift monitoring circuit in accordance with one or more embodiments of the disclosure.

The output of the buffer 104 provides a filtered buffer signal S2 to the rising edge detector 106 and the falling edge detector 108. In one or more embodiments of the disclosure, the buffer 104 is a Schmitt trigger buffer that can be configured to remove the noise from the input signal and generate a square wave. The rising edge detector 106 is configured to detect the rising edge of the filtered buffer signal S2. A waveform representing the rising edge signal S5 is shown in FIGS. 2 and 3. The falling edge detector 108 is configured to detect the falling edge of the filtered buffer signal S2. A waveform representing the falling edge signal S3 is shown in FIGS. 2 and 3. The rising edge detector 106 can comprise various arrangements of circuit components to detect the rising edge of the signal. Similarly, the falling edge detector 108 can comprise various arrangements of circuit components to detect the falling edge of the signal. Any known configuration of the rising edge detector 106 or falling edge detector 108 can be implemented into the circuit 100.

The output of the falling edge detector 108 provides the falling edge signal to the re-triggerable one-shot 110 which is configured to output an extended falling edge signal S4 of a predetermined duration. In other words, the re-triggerable one-shot 110 extends the high portion of the signal for a configurable period. The extended falling edge signal S4 is output of the one-shot 110 and the output of the rising edge detector 106 is provided to the AND gate 112 of the circuit 100. The AND gate 112 detects if an overlap of the received signals occurs. If an overlap between the rising edge and the output of the re-triggerable one-shot 110 is detected at the AND gate 112, a logic high representing an overlap signal S6 is output of the AND gate 112. The overlap can indicate a fault condition where the first clock and the second clock have drifted beyond an acceptable threshold duration, where the threshold duration is set by the one-shot 110. If the rising edge and the output of the re-triggerable one-shot 110 do not overlap, then there is no fault condition detected at the AND gate 112 or the first clock and the second clock are operating within a pre-defined threshold of one another. In one or more embodiments of the disclosure, the output of the AND gate 112 can be provided to a fault latch circuit. The fault latch circuit may be used in scenarios where the downstream processing element(s) is unable to read the output of the AND gate 112 often enough. In such a scenario, a fault signal (clk_fault) S7 is provided to a downstream processing element or process.

One or more illustrative embodiments of the disclosure are described herein. Such embodiments are merely illustrative of the scope of this disclosure and are not intended to be limiting in any way. Accordingly, variations, modifications, and equivalents of embodiments disclosed herein are also within the scope of this disclosure.

FIG. 2 depicts a timing diagram 200 illustrating an example where a fault is detected by the clock drift monitoring circuit 100 in accordance with one or more embodiments of the disclosure. The waveforms of the timing diagram 200 are generated at various points in the circuit 100 and will be discussed below. The x-axis of the timing diagram 200 represents the time measured in milliseconds (ms), and the y-axis represents the amplitude of the voltage of the waveforms. The waveform 202 represents the filtered XOR signal S1 that is output from the XOR gate which receives the first clock signal and the second clock signal.

The waveform 204 represents the filtered buffer signal S2 which provides a square wave with a frequency equal to the absolute value of the frequency difference between the two monitored clocks, the first clock signal and the second clock signal. The waveform 206 and the waveform 210 represent the detection of the falling edge signal S3 and the rising edge signal S5, respectively. The waveform 208 represents the extended falling edge signal S4 that is triggered by the falling edge signal S3 of the waveform 204. The extended falling edge signal can be configured to correspond to a threshold to determine an unacceptable clock drift. For example, the extended falling edge signal can be configured to remain high for 5 ms, 10 ms, 15 ms, etc. based on the circuit component values or configuration that is selected for the re-triggerable one shot 110.

The waveform 212 represents an overlap detection signal S6 when the extended falling edge signal S4 overlaps the rising edge signal S5. This overlap indicates a fault condition where the first clock signal and the second clock signal have drifted over an acceptable amount. As a result, the waveform representing the fault signal S7 can be provided to a downstream process.

FIG. 3 depicts a timing diagram 300 illustrating an example where no fault is detected by the clock drift monitoring circuit in accordance with one or more embodiments of the disclosure. The waveforms 302, 304, 306, 310 are similar to the waveforms illustrated in FIG. 2. In this non-limiting example, the extended falling edge signal S4 is triggered by the falling edge of the filtered buffer signal S2. The duration of the high portion of the extended falling edge signal S4 is configured to be shorter than the extended falling edge signal S4 shown in FIG. 2. As a result, there is no overlap detected between the extended falling edge signal S4 and the rising edge signal S5, and no overlap is detected in signal S6. Therefore, a no-fault signal S7 is produced as shown in FIG. 3.

Figure 4:
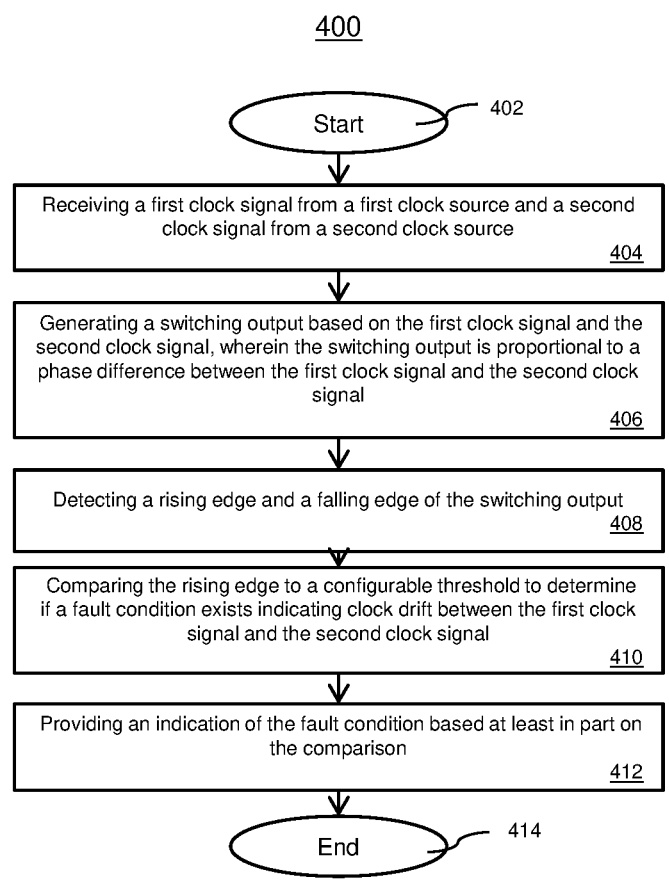
FIG. 4 depicts a flowchart of a method for monitoring clock drift using the clock drift monitoring circuit in accordance with one or more embodiments of the disclosure.

Now referring to FIG. 4, a flowchart of a method 400 for monitoring clock drift in accordance with one or more embodiments of the disclosure is provided. The method 400 begins at block 402 and continues to block 404. At block 404, the XOR logic gate of the clock drift circuit receives a first clock signal from a first clock source and a second clock signal from a second clock source. The first clock signal and the second clock signal may originate from independent clock sources. In one or more embodiments of the disclosure, the first clock signal and the second clock signal, when having different frequencies, may be provided a first clock divider circuit and a second clock divider circuit, respectively, to obtain nominal first and second clock signals that can be appropriately compared at the XOR logic gate.

At block 406, the XOR logic gate generates a switching output based on the first clock signal and the second clock signal, wherein the switching output is proportional to a phase difference between the first clock signal and the second clock signal. In one or more embodiments, the switching output of the XOR gate can be filtered using a Schmitt trigger buffer to generate a square wave signal having a duty cycle. The duty cycle of the switching output of the XOR gate corresponds to a phase difference between the first clock signal and the second clock signal.

At block 408, a rising edge detector and a falling edge detector are used to detect the rising edge and the falling edge of the switching output. The falling edge signal can be used to trigger a re-triggerable one-shot circuit to generate an extended falling edge signal. The duration of the extended falling edge signal corresponds to the configurable threshold duration to determine whether the clock drift between the first clock signal and the signal clock signal is within an acceptable tolerance. The extended falling edge signal can be configured according to various applications. At block 410, a logic gate compares the rising edge to a configurable threshold to determine if a fault condition exists indicating a clock drift between the first clock signal and the second clock signal. The comparison comprises receiving the rising edge and the extended falling edge at a logic gate (e.g., AND gate) to determine if the rising edge of the switching output overlaps the extended falling edge. If the rising edge overlaps the extended falling edge, an indication of the fault condition can be provided to a downstream process.

At block 412, the logic gate provides an indication of the fault condition based at least in part on the comparison. In one or more embodiments of the disclosure, the indication of the fault condition may be provided to a latch circuit and further provided to a downstream process for analysis.

The method 400 ends at block 414. The process flow diagram of FIG. 4 is not intended to indicate that the operations of the method 400 are to be executed in any particular order, or that all of the operations of the method 400 are to be included in every case. Additionally, the method 400 can include any suitable number of additional operations Technical effects of embodiments of the present disclosure include monitoring clock drift without the use of frequency counters, phase-locked loops (PLL), or other high-frequency measurement techniques. In addition, high-speed clock signals need not be routed to each individual processing element which further simplifies the board layout of the design.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method for monitoring clock drift, the method comprising:
receiving a first clock signal from a first clock source and a second clock signal from a second clock source;
generating a switching output based on the first clock signal and the second clock signal, wherein the switching output is proportional to a phase difference between the first clock signal and the second clock signal;
detecting a rising edge and a falling edge of the switching output;
generating a rising edge detection signal based on the rising edge and a falling edge detection signal based on falling edge;
delivering the rising edge detection signal to a first input of an AND gate and the falling edge detection signal to a second input of the AND gate
comparing, by the AND gate, the rising edge to a configurable threshold to determine if a fault condition exists indicating clock drift between the first clock signal and the second clock signal; and
providing an indication of the fault condition based at least in part on the comparison.

2. The method of claim 1, wherein receiving the first clock signal and the second clock signal comprises receiving the first clock signal and the second clock signal at an exclusive-OR gate.

3. The method of claim 2, wherein the exclusive-OR gate generates the switching output based on the first clock signal and the second clock signal.

4. The method of claim 3, wherein the switching output is filtered using a Schmitt trigger buffer to generate a square wave signal having a duty cycle.

5. The method of claim 4, wherein the duty cycle indicates a phase difference between the first clock signal and the second clock signal.

6. The method of claim 1, wherein the configurable threshold corresponds to an extended falling edge that is triggered by the falling edge of the switching output.

7. The method of claim 6, wherein comparing the rising edge to the configurable threshold comprises receiving the rising edge and the extended falling edge at a logic gate to determine if the rising edge overlaps the extended falling edge.

8. The method of claim 7, further comprising providing the indication of the fault condition responsive to determining the rising edge overlaps the extended falling edge.

9. The method of claim 1, wherein a frequency of the first clock signal is different than a frequency of the second clock signal.

10. The method of claim 9, wherein the first clock signal and the second clock signal are received at a first clock divider and a second clock divider, respectively, wherein the first clock divider and the second divider are used to obtain a nominal signal of the first clock signal and the second clock signal for the comparison.

11. A circuit for monitoring clock drift, the circuit comprising:
an XOR gate configured to receive a first clock signal from a first clock source and a second clock signal from a second clock source, wherein the XOR logic gate is further configured to generate a switching output based on an XOR operation of the first clock signal and the second clock signal;
a rising edge detector and a falling edge detector configured to detect a rising edge and generate a rising edge detection signal based on the rising edge, and to detect a falling edge of the switching output and generate a falling edge detection signal based on falling edge; and
an AND gate including a first input that receives the rising edge detection signal and a second input that receives the falling edge detection signal, the AND gate configured to threshold compare the rising edge to a configurable threshold to determine if a fault condition exists indicating clock drift between the first clock signal and the second clock signal, and provide an indication of the fault condition based at least in part on the comparison.

12. The circuit of claim 11, wherein the switching output is proportional to a phase difference between the first clock signal and the second clock signal.

13. The circuit of claim 12, wherein the XOR gate is configured to generate the switching output based on the first clock signal and the second clock signal.

14. The circuit of claim 13, further comprising a Schmitt trigger buffer configured to receive the switching output from the XOR gate and generate a square wave signal having a duty cycle.

15. The circuit of claim 14, wherein the duty cycle indicates a phase difference between the first clock signal and the second clock signal.

16. The circuit of claim 11, further comprising a re-triggerable one-shot circuit configured to generate an extended falling edge signal that is triggered by the falling edge of the switching output, wherein the extended falling edge signal corresponds to the configurable threshold.

17. The circuit of claim 16, wherein the AND gate is configured to receive the rising edge and the extended falling edge to determine if the rising edge overlaps the extended falling edge to compare the rising edge to the configurable threshold.

18. The circuit of claim 17, wherein the AND gate is configured to provide an output indicating the fault condition responsive to determining the rising edge overlaps the extended falling edge.

19. The circuit of claim 11, wherein a frequency of the first clock signal is different than a frequency of the second clock signal.

20. The circuit of claim 19, further comprising a first clock divider and a second clock divider configured to receive the first clock signal and the second clock signal, respectively, and the first clock divider and the second divider are configured to obtain a nominal signal of the first clock signal and the second clock signal for the comparison.

* * * * *